(12) United States Patent
Gambino et al.

(10) Patent No.: US 11,670,655 B2
(45) Date of Patent: Jun. 6, 2023

(54) EDGE SEALS FOR SEMICONDUCTOR PACKAGES

(71) Applicant: SEMICONDUCTOR COMPONENTS INDUSTRIES, LLC, Phoenix, AZ (US)

(72) Inventors: Jeffrey Peter Gambino, Gresham, OR (US); Kyle Thomas, San Francisco, CA (US); David T. Price, Gresham, OR (US); Rusty Winzenread, San Jose, CA (US); Bruce Greenwood, Gresham, OR (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 339 days.

(21) Appl. No.: 16/537,149

(22) Filed: Aug. 9, 2019

(65) Prior Publication Data
US 2019/0363124 A1    Nov. 28, 2019

Related U.S. Application Data

(62) Division of application No. 15/421,505, filed on Feb. 1, 2017, now Pat. No. 10,431,614.

(51) Int. Cl.
*H01L 27/146* (2006.01)

(52) U.S. Cl.
CPC .. *H01L 27/14618* (2013.01); *H01L 27/14634* (2013.01); *H01L 27/14636* (2013.01)

(58) Field of Classification Search
CPC ......... H01L 27/14618; H01L 27/14634; H01L 27/146361; H01L 25/0657; H01L 27/14636; H01L 27/1464; H01L 27/14623; H01L 31/02164; H01L 27/14609; H01L 27/14687; H01L 25/06571
(Continued)

(56) References Cited

U.S. PATENT DOCUMENTS

2008/0135732 A1*  6/2008  Toumiya ........... H01L 27/14632
                                                       250/208.1
2009/0224345 A1     9/2009  Lee et al.
(Continued)

OTHER PUBLICATIONS

P. Enquist et al., "Low Cost of Ownership Scalable Copper Direct Bond Interconnect 3D IC Technology for Three Dimensional Integrated Circuit Applications," IEEE 3D System Integration, 2009.
(Continued)

*Primary Examiner* — Mouloucoulaye Inoussa
(74) *Attorney, Agent, or Firm* — Adam R. Stephenson, Ltd.

(57) ABSTRACT

Implementations of semiconductor packages may include: a digital signal processor having a first side and a second side and an image sensor array, having a first side and a second side. The first side of the image sensor array may be coupled to the second side of the digital signal processor through a plurality of hybrid bond interconnect (HBI) bond pads and an edge seal. One or more openings may extend from the second side of the image sensor array into the second side of the digital signal processor to an etch stop layer in the second side of the digital signal processor. The one or more openings may form a second edge seal between the plurality of HBI bond pads and the edge of the digital signal processor.

11 Claims, 5 Drawing Sheets

(58) Field of Classification Search
USPC .................. 257/435, E31.001, 459; 438/70
See application file for complete search history.

(56) References Cited

U.S. PATENT DOCUMENTS

| | | | |
|---|---|---|---|
| 2011/0227180 A1 | 9/2011 | Murakoshi | |
| 2013/0107075 A1* | 5/2013 | Kobayashi | H01L 27/1464 348/222.1 |
| 2013/0307103 A1 | 11/2013 | Lin et al. | |
| 2014/0048853 A1 | 2/2014 | Choi et al. | |
| 2014/0124889 A1 | 5/2014 | Qian et al. | |
| 2015/0035109 A1* | 2/2015 | Kataoka | H01L 23/481 257/443 |
| 2015/0349228 A1* | 12/2015 | Kumano | H01L 23/5384 257/91 |
| 2016/0020235 A1* | 1/2016 | Yamashita | H01L 27/14612 250/208.1 |
| 2016/0379962 A1 | 12/2016 | Huang et al. | |

OTHER PUBLICATIONS

J. P. Gambino et al., "Reliability of Segmented Edge Seal Ring for RF Devices", IITC Proc., 2014, p. 367.
J. Drab, "Multilevel Wafer Stacking for 3D Circuit Integration", Technology Today, 2015, www.raytheon.com.

* cited by examiner

EDGE SEALS FOR SEMICONDUCTOR PACKAGES

CROSS REFERENCE TO RELATED APPLICATIONS

This application is a divisional application of the earlier U.S. Utility Patent Application to Gambino et al. entitled "Edge Seals for Semiconductor Packages," application Ser. No. 15/421,505, filed Feb. 1, 2017, now pending, the disclosure of which is hereby incorporated entirely herein by reference.

BACKGROUND

1. Technical Field

Aspects of this document relate generally to semiconductor packages. Specific implementations include as hybrid bonded three dimensional structures for image sensors.

2. Background

To form three dimensional structures, a hybrid bonding interface is used including hybrid bonds and conductive bonds. In standard hybrid bonding interfaces, a uniform array of vias on both wafers is used to ensure proper height for the conductive bonds.

SUMMARY

Implementations of semiconductor packages may include: a digital signal processor having a first side and a second side. An image sensor array may be included, having a first side and a second side, where the first side of the image sensor array is coupled to the second side of the digital signal processor through a plurality of hybrid bond interconnect (HBI) bond pads and an edge seal. An etch stop layer may be included in the second side of the digital signal processor. One or more openings may extend from the second side of the image sensor array into the second side of the digital signal processor and to the etch stop layer in the second side of the digital signal processor. The one or more openings may be coated with a sealing material. The one or more openings may also form a second edge seal between the plurality of HBI bond pads and the edge of the digital signal processor. The edge seal may include a first metal stack included within the digital signal processor and a second metal stack included within the image sensor array electrically coupled together.

Implementations of semiconductor packages may include one, all, or any of the following:

The one or more openings may be positioned outside the edge seal.

The one or more opening may be positioned inside the edge seal.

The sealing material may be one of oxynitride (ONO), silicon nitride (SiN), aluminum nitride (AlN), and any combination thereof.

The semiconductor package may further include one or more second openings extending from the second side of the image sensor array to the second metal stack included in the image sensor, the one or more second openings forming a third edge seal where the one or more second openings each have a sealing material therein.

The sealing material of the one or more second openings may be one of oxynitride (ONO), aluminum oxide ($Al_2O_3$), silicon nitride (SiN), hafnium dioxide ($HfO_2$), tantalum oxide ($Ta_2O_5$), and any combination thereof.

The semiconductor package may further include one or more third openings extending from the second side of the image sensor array to the etch stop layer in the digital signal processor forming a fourth edge seal wherein the one or more third openings may be positioned one of inside or outside the edge seal.

Implementations of semiconductor packages may include: a digital signal processor, having a first side and a second side, the second side having an etch stop layer. An image sensor array having a first side and a second side may be included. The first side may have the image sensor array mechanically and electrically coupled to the second side of the digital signal processor through a plurality of hybrid bond interconnect (HBI) bond pads and an edge seal on an outer edge of the semiconductor package. A first metal stack may be included within the digital signal processor and a second metal stack may be included in the image sensor array, wherein the first metal stack is electrically coupled with the second metal stack through one of the plurality of HBI bond pads. The semiconductor package may include one or more first openings, where the one or more first openings may extend into the second side of the image sensor array to the etch stop layer in the digital signal processor. The one or more first openings may form a second edge seal. One or more second openings may extend into the second side of the image sensor array to the second metal stack included in the image sensor. The one or more second openings may form a third edge seal. The one or more first openings and the one or more second openings may each have a sealing material therein.

Implementations of semiconductor packages may include one, all, or any of the following:

The sealing material on the one or more first openings may be one of oxynitride (ONO), silicon nitride (SiN), aluminum nitride (AlN), and any combination thereof.

The sealing material on the one or more second openings may be one of oxynitride (ONO), aluminum oxide ($Al_2O_3$), silicon nitride (SiN), hafnium dioxide ($HfO_2$), tantalum oxide ($Ta_2O_5$), and any combination thereof.

The semiconductor package may further include one or more third openings extending into the second side of the image sensor array to the etch stop layer in the digital signal processor thereby forming a fourth edge seal. The one or more third openings may be positioned one of inside or outside the edge seal.

Implementations of semiconductor packages may include: a digital signal processor, having a first side and a second side. An image sensor array may be included having a first side and a second side, the first side of the image sensor array mechanically and electrically coupled to the second side of the digital signal processor through one or more hybrid bond interconnect (HBI) bond pads and an edge seal. A first metal stack may be included within the digital signal processor. A second metal stack may be included in the image sensor array. A via bar may be included having a width that is smaller than a width of the HBI bond pads. The via bar may electrically couple the first metal stack and the second metal stack. The via bar may form an additional seal inside the edge seal.

Implementations of semiconductor packages may include one, all, or any of the following:

The additional edge seal formed by the via bar may be continuous.

The additional edge seal formed by the via bar may include spaces therein.

The via bar may include copper.

The semiconductor package may further include one or more first openings, the one or more first openings extending into the second side of the image sensor array to an etch stop layer in the digital signal processor. The one or more openings may be located between the edge seal and the plurality of HBI bond pads. The one or more first openings may form a second edge seal. The one or more first openings may include a sealing material.

The semiconductor package may further include one or more second openings extending into the second side of the image sensor array to the second metal stack included in the image sensor. The one or more second openings may form a third edge seal. The one or more second openings may include a sealing material.

The sealing material on the one or more first openings may be one of oxynitride (ONO), silicon nitride (SiN), aluminum nitride (AlN), and any combination thereof.

The sealing material on the one or more second openings may be one of oxynitride (ONO), aluminum oxide ($Al_2O_3$), silicon nitride (SiN), hafnium dioxide ($HfO_2$), tantalum oxide ($Ta_2O_5$), and any combination thereof.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor packages will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages and implementing components and methods, consistent with the intended operation and methods.

Figure 1:
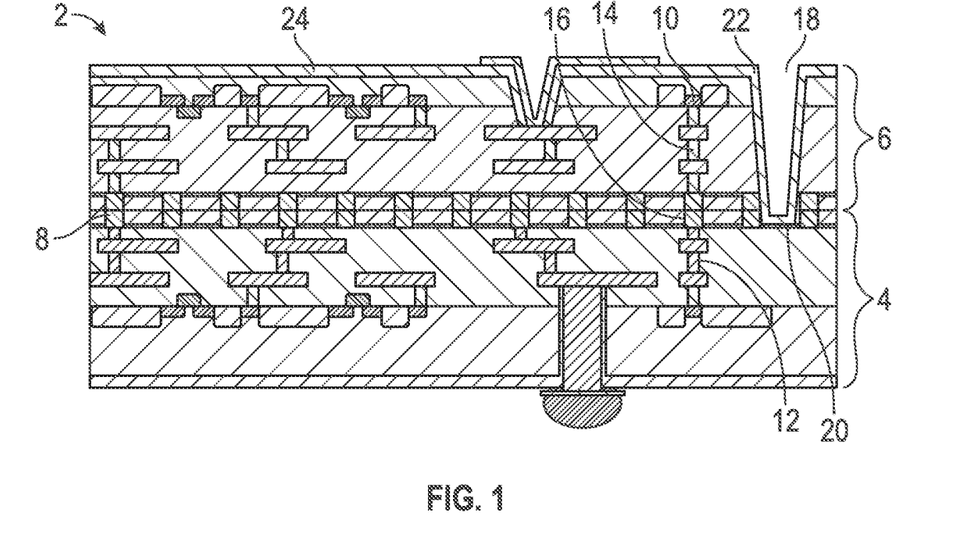
FIG. 1 is a cross sectional view of an implementation of a semiconductor package having a first opening to the right of the edge seal.

Referring to FIG. 1, a semiconductor package is illustrated 2. The semiconductor package includes a digital signal processor 4 having a first side and a second side and an image sensor array 6 having a first side and a second side. The second side of the digital signal processor 4 is coupled to the first side of the image sensor array 6 through a hybrid bond interconnect (HBI) process. The HBI process uses a hybrid bond, the hybrid bond including conductive bonds between conductor regions (HBI bond pads) of two wafers and hybrid bonds between insulator regions of two wafers. The hybrid bonding allows for electrical connections to be formed and forms a mechanically stable structure between the two wafers. In some implementations, the HBI bond pads may be metal such as copper, nickel, gold, or other suitable metals known in the art. In other implementations, the HBI bond pads may be made of other non-metal conductive material. In this particular implementation, the HBI bond pads are copper (Cu) forming Cu—Cu bonds between the two wafers 4 and 6 and oxide-oxide bonds formed between the wafer material. The insulator regions of the wafer may include silicon dioxide ($SiO_2$), other suitable dielectric materials, or a combination thereof.

The first side of the image sensor array 6 is coupled to the second side of the digital signal processor 4 through a plurality of HBI bond pads 8 and an edge seal 10. The edge seal 10, in this implementation, includes a first metal stack 12 within the digital signal processor 4 bonded to a second metal stack 14 within in the image sensor array 6. The first metal stack 12 is bonded to the second metal stack 14 through HBI bonding pads 16. In this particular implementation, a first opening 18 is formed to the right of the edge seal 10. In various implementations, semiconductor packages may have one or more first openings 18. In the implementation illustrated, the first opening 18 extends from the second side of the image sensor array 6 to the second side of the digital signal processor 4. The first opening 18 extends to/into the etch stop layer 20 in the second side of the digital signal processor 4. In various implementations, the first opening 18 may be coated with a sealing material 22 and may form a second edge seal between the plurality of HBI bond pads 8 and the edge seal 10. In this implementation, the semiconductor package is coated with an anti-reflective coating 24. The anti-reflective coating 24 may be the same material as the sealing material 22. In various implementations, the sealing material may include one of oxynitride (ONO), silicon nitride (SiN), aluminum nitride (AlN), any combination thereof, or any other suitable material known disclosed herein or known in the art for sealing a semiconductor opening's sidewalls. In other implementations, the one or more first openings may be positioned between the active area of the semiconductor package and the edge seal 10. In still other implementations, the one or more first openings may also be positioned between the edge seal 10 and the edge of the semiconductor package as shown in FIG. 1.

Figure 2:
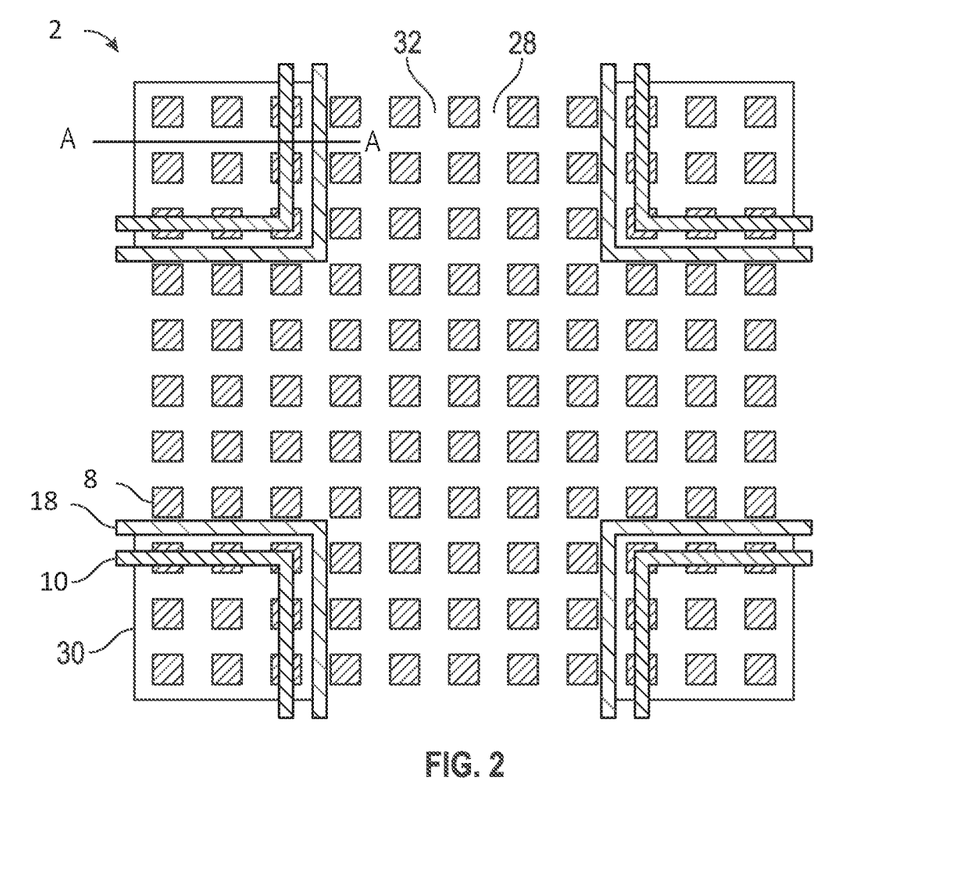
FIG. 2 is a top view of implementations of four semiconductor packages as seen in FIG. 1, before singulation.

Referring to FIG. 2, a top view of four semiconductor packages 2 is illustrated. This view shows a portion of a pre-singulated image sensor array wafer 28 having four discrete digital signal processor chips 30 bonded thereto forming four semiconductor packages 2. As a final step of manufacturing all material in the saw street intersection 32 is removed during singulation via sawing.

As previously described, hybrid bonding allows for formation of three dimensional (3D) structures with a fine pitch (<10 μm). However, the layout of the HBI bond pads is very restrictive as conventionally a uniform array of vias is required across both wafers to ensure that the copper (or other metal) height is well controlled. For example, too much dishing in high pattern density regions can cause incomplete bonding. In conventional HBI bond pad layouts, there may be gaps in the edge seal ring that may allow moisture to diffuse into the active region of the die causing oxidation of Cu vias and reliability failures of the device. Referring back to FIG. 2, the one or more first openings 18 may be positioned between the plurality of HBI bond pads 8 and the edge seal 10 to create a second edge seal for the semiconductor package. The one or more first openings 18 may be continuous forming a trench-like structure to form a second edge seal. In other implementations, the one or more first openings 18 may be discrete openings sealing particular areas of the semiconductor packages. As previously described, the second edge seal 18 may be positioned on the outside the edge seal meaning on the outer edge of the semiconductor package or may be positioned inside the edge seal meaning between the edge seal and the active area of the die.

Figure 3:
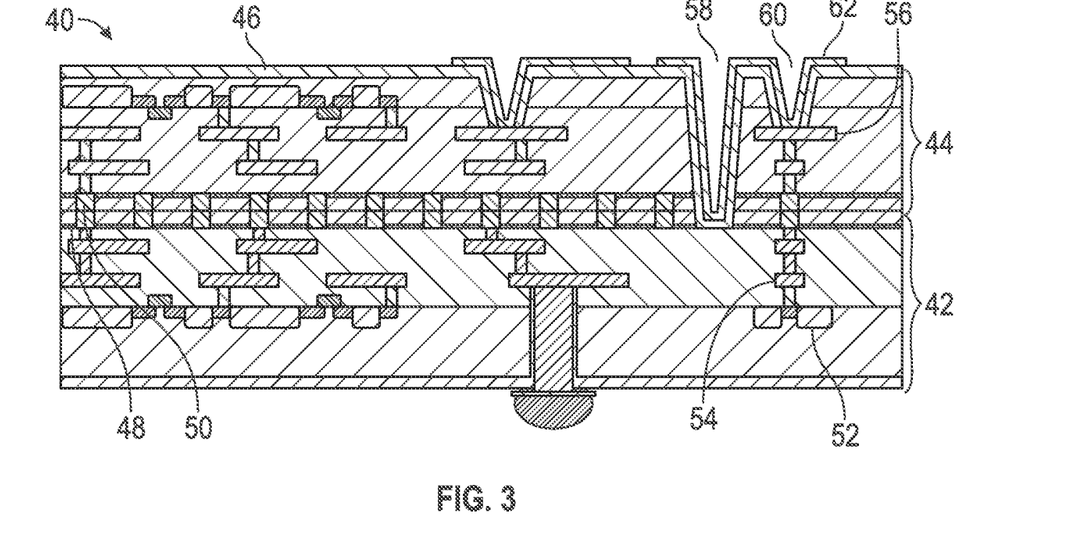
FIG. 3 is a cross sectional view of an implementation of a semiconductor package having a first opening and a second opening as described herein.

Referring now to FIG. 3, another implementation of a semiconductor package 40 is illustrated. In this implementation, a second side of a digital signal processor 42 is electrically and mechanically coupled to a first side of an image sensor array 44. The second side of the image sensor array 44 is coated with an anti-reflective coating (ARC) 46. An etch stop layer 48 is included in the second side of the digital signal processor 42. Similar to the implementation previously described, the wafers are bonded through a plurality of HBI bond pads 50 and an edge seal 52. The edge seal 52 includes a first metal stack 54 within the digital signal processor 42 and a second metal stack 56 within the image sensor array 44. In this implementation, one or more first openings 58 are positioned between the active area of the die and the edge seal 52. The one or more first openings 58 form a second edge seal protecting the active area of the die. In this particular implementation, one or more second openings 60 extend from the second side of the image sensor array 44 to the second metal stack 56 within the image sensor array 44 forming a third edge seal. The one or more second openings 60 are coated with a sealing material 62 therein. The sealing material may include ONO, aluminum oxide ($Al_2O_3$), SiN, hafnium dioxide ($HfO_2$), tantalum oxide ($Ta_2O_5$), any combination thereof, or any other suitable material disclosed herein or known in the art.

Figure 4:
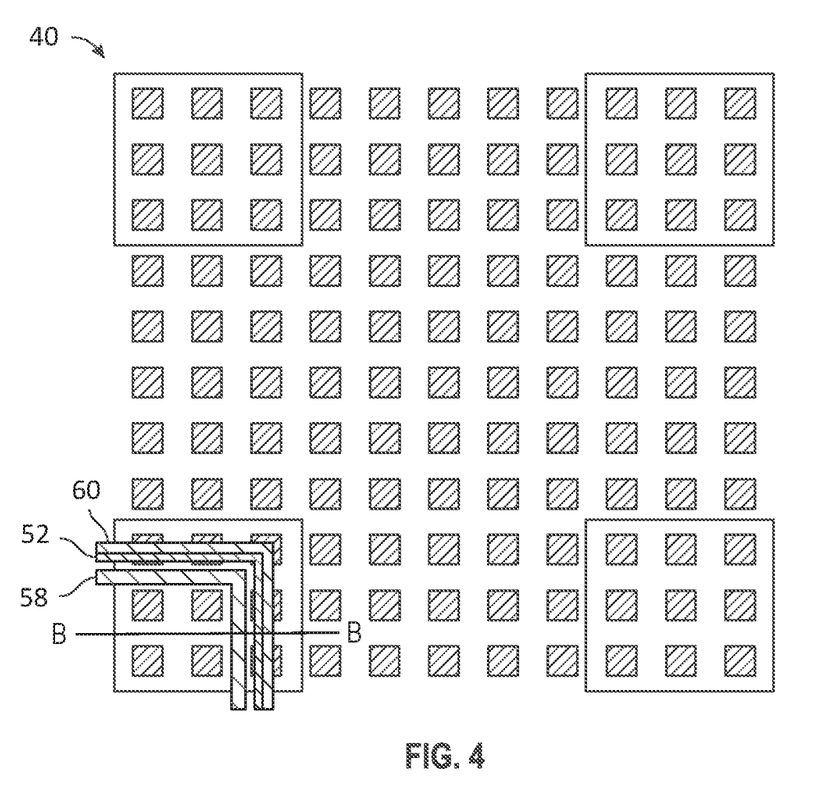
FIG. 4 is a top view of implementations of four semiconductor packages as seen in FIG. 3, before singulation.

Referring to FIG. 4, a top view of a semiconductor package 64 having one or more first openings and one or more second openings is illustrated. In this view, one or more second openings 60 are shown forming a third edge seal next to/adjacent to the edge seal formed by the metal stacks as described above. In this particular implementation, the second edge seal 58 formed by the one or more first openings is located between the edge seal 52 and the active area of the die. In additional implementations, one or more third openings may extend into the second side of the image sensor array to the etch stop layer in the digital signal processor forming a fourth edge seal. The one or more third openings may be positioned inside (on the active region side) or outside (on the scribe line region side) of the edge seal of the semiconductor package.

Figure 5:
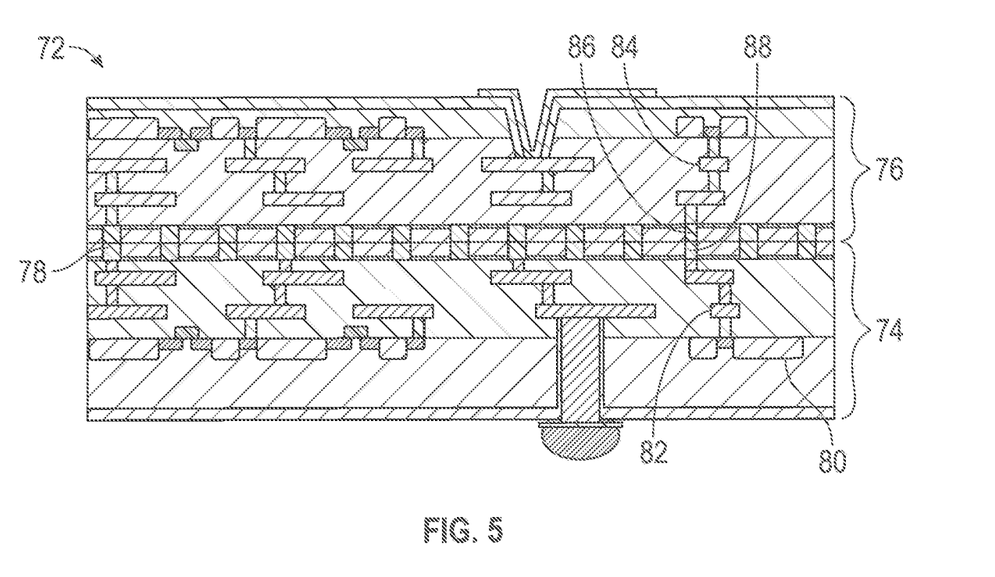
FIG. 5 is a cross sectional view of an implementation of a semiconductor package having an additional seal formed through a narrow via bar.

Referring now to FIG. 5, a cross sectional view of an additional implementation of a semiconductor package 72 is illustrated. A second side of a digital sensor processor 74 is coupled with a first side of an image sensor array 76 through a plurality of HBI bond pads 78 and an edge seal 80. A first metal stack 82 is included within the digital signal processor 74 and a second metal stack 84 is included within the image sensor array 76. The first metal stack 82 and the second metal stack 84 are electrically coupled through a via bar 86 having a width that is smaller than a width of the plurality of HBI bond pads 78. In the implementation illustrated, the width of the via bar 86 is approximately 25-75% smaller than the width of the HBI bond pads 78. The via bar 86 forms an additional seal 88 inside the edge seal 80. The additional seal 88 formed by the via bar 86 may be continuous or it may have spaces therein when viewed from above the via bar 86. The via bar may include Cu, nickel, gold, or any suitable material known in the art.

Figure 6:
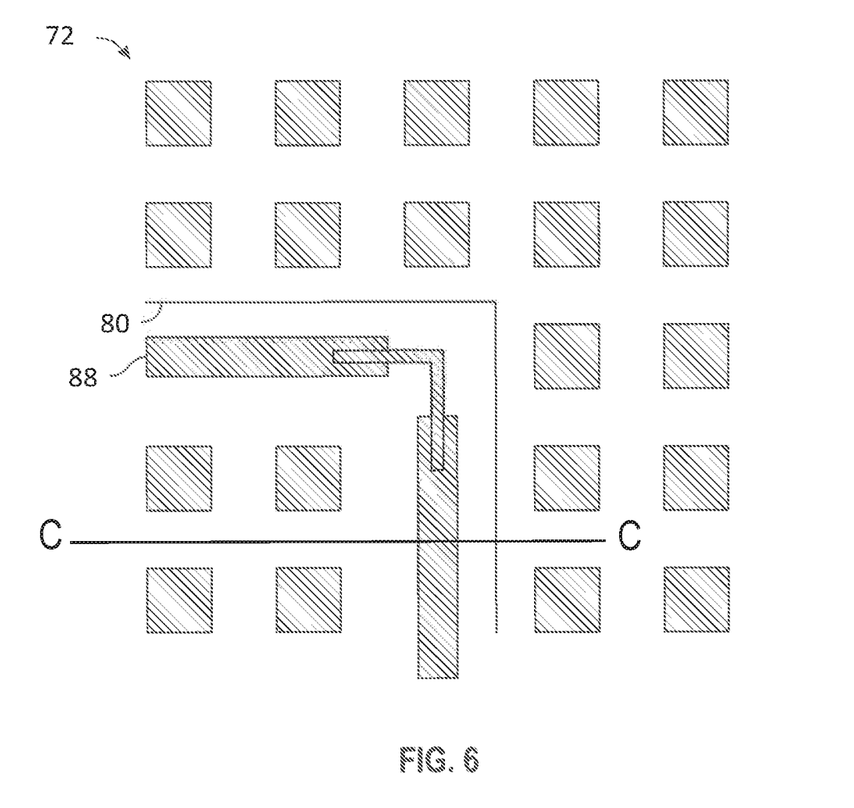
FIG. 6 is a top view of an additional seal formed through a narrow via bar.
Figure 7:
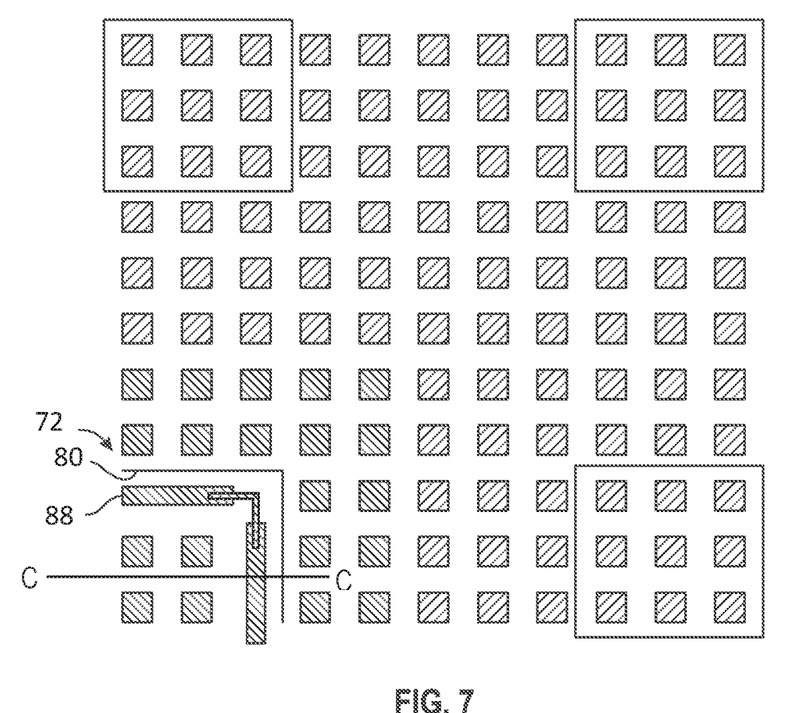
FIG. 7 is a top view of an image sensor array having an additional edge seal formed through a narrow via bar.

Referring to FIG. 6 and FIG. 7, a top view of the semiconductor package 72 from FIG. 5 is illustrated. The additional seal 88 formed by the via bar is located inside the edge seal 80 formed by the metal stacks. Because the additional seal 88 formed by the via bar is located at the die corner, it may facilitate bonding between the digital signal processor and the image sensor array. Because the corner of the die is bonded all the way around the corner at the via bar, the risk of chipping and other moisture ingress during the sawing process may be reduced. Furthermore, the additional seal 88 may facilitate local pattern density compensation to control Cu dishing across all Cu interfaces during chemical mechanical polishing (CMP).

In various implementations, the additional seal 88 may be used in combination with of the one or more first opening implementations and the one or more second opening implementations to form additional edge seals as desired. In other implementations, the additional seal 88 may be used by itself in wafer bonding implementations disclosed herein, without any of the one or more first opening implementations and/or one or more second opening implementations.

Figure 8:
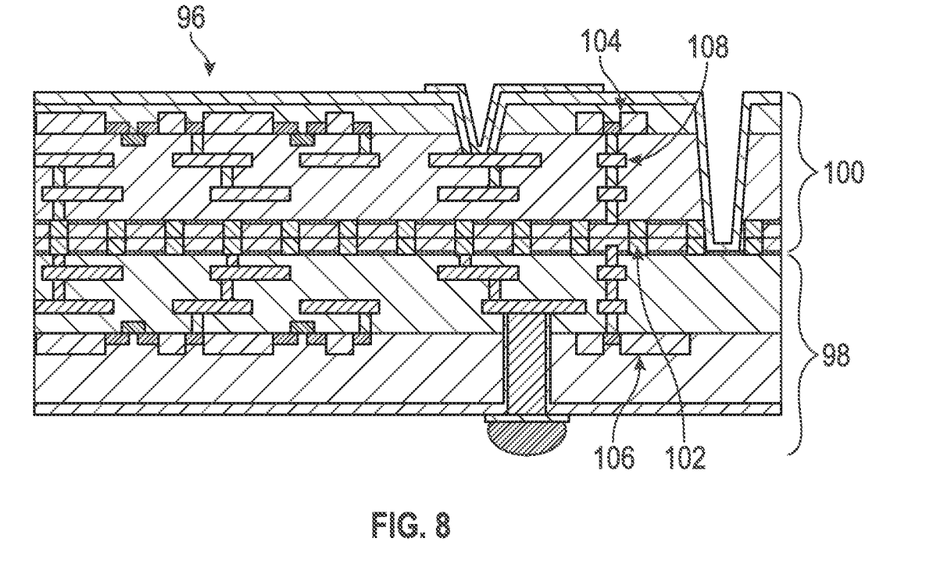
FIG. 8 is a cross sectional view of another implementation of a semiconductor package as described herein.

Referring now to FIG. 8, another implementation of semiconductor package 96 is illustrated. A second side of a digital sensor processor 98 is coupled with a first side of an image sensor array 100 through a plurality of HBI bond pads 102 and an edge seal 104. A first metal stack 106 is included within the digital signal processor 98 and a second metal stack 108 is included within the image sensor array 100. In this implementation, the HBI bonds 102 are completely separated from the edge seal 104. This implementation may reduce stress between the edge seal 104 and the HBI 102. This implementation may be used by itself as a different edge seal implementation or in combination with any of the other previously described opening implementations and/or via bar implementations. A wide variety of possible applications for edge seals like those illustrated in FIG. 8 may be appreciated by those of ordinary skill in the art.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:
1. A semiconductor package comprising:
a digital signal processor comprising a first side and a second side;
an image sensor array comprising a first side and a second side, the first side of the image sensor array coupled to the second side of the digital signal processor through a plurality of hybrid bond interconnect (HBI) bond pads and a first edge seal coupled directly with the plurality of HBI bond pads;

an etch stop layer comprised in the second side of the digital signal processor;

one or more first openings extending from the second side of the image sensor array into the second side of the digital signal processor and to the etch stop layer in the second side of the digital signal processor, the one or more first openings coated with sealing material, the one or more first openings forming a second edge seal between the plurality of HBI bond pads and an edge of the digital signal processor;

one or more second openings extending from the second side of the image sensor array to a second metal stack comprised in the image sensor, the one or more second openings forming a third edge seal wherein the one or more second openings each comprise sealing material therein; and one or more third openings extending from the second side of the image sensor array to the etch stop layer in the digital signal processor forming a fourth edge seal wherein the one or more third openings may be positioned one of inside and outside the first edge seal;

wherein the first edge seal is comprised of a first metal stack comprised within the digital signal processor directly coupled to the second metal stack comprised within the image sensor array.

2. The semiconductor package of claim 1, wherein the one or more first openings are positioned inside the first edge seal.

3. The semiconductor package of claim 1, wherein the sealing material on the one or more first openings is one of oxynitride (ONO), silicon nitride (SiN), aluminum nitride (AlN), and any combination thereof.

4. The semiconductor package of claim 1, wherein the sealing material on the one or more second openings is one of oxynitride (ONO), aluminum oxide ($Al_2O_3$), silicon nitride (SiN), hafnium dioxide ($HfO_2$), tantalum oxide ($Ta_2O_5$), and any combination thereof.

5. The semiconductor package of claim 1, wherein the sealing material on the one or more third openings is one of oxynitride (ONO), aluminum oxide ($Al_2O_3$), silicon nitride (SiN), hafnium dioxide ($HfO_2$), tantalum oxide ($Ta_2O_5$), and any combination thereof.

6. A semiconductor package comprising:
a digital signal processor comprising a first side and a second side;
an image sensor array comprising a first side and a second side, the first side of the image sensor array coupled to the second side of the digital signal processor through a plurality of hybrid bond interconnect (HBI) bond pads and a first edge seal coupled directly with the plurality of HBI bond pads;

an etch stop layer comprised in the second side of the digital signal processor;

one or more first openings extending from the second side of the image sensor array into the second side of the digital signal processor and to the etch stop layer in the second side of the digital signal processor, the one or more first openings coated with sealing material, the one or more first openings forming a second edge seal between the plurality of HBI bond pads and an edge of the digital signal processor; and one or more second openings extending from the second side of the image sensor array to a second metal stack comprised in the image sensor, the one or more second openings forming a third edge seal wherein the one or more second openings each comprise sealing material therein;

wherein the first edge seal is comprised of a first metal stack comprised within the digital signal processor directly coupled to the second metal stack comprised within the image sensor array.

7. The semiconductor package of claim 6, wherein the one or more first openings is positioned inside the first edge seal.

8. The semiconductor package of claim 6, one or more third openings extending from the second side of the image sensor array to the etch stop layer in the digital signal processor forming a fourth edge seal wherein the one or more third openings may be positioned one of inside and outside the first edge seal.

9. The semiconductor package of claim 6, wherein the sealing material on the one or more first openings is one of oxynitride (ONO), silicon nitride (SiN), aluminum nitride (AlN), and any combination thereof.

10. The semiconductor package of claim 6, wherein the sealing material on the one or more second openings is one of oxynitride (ONO), aluminum oxide ($Al_2O_3$), silicon nitride (SiN), hafnium dioxide ($HfO_2$), tantalum oxide ($Ta_2O_5$), and any combination thereof.

11. The semiconductor package of claim 8, wherein the sealing material on the one or more second openings is one of oxynitride (ONO), aluminum oxide ($Al_2O_3$), silicon nitride (SiN), hafnium dioxide ($HfO_2$), tantalum oxide ($Ta_2O_5$), and any combination thereof.

* * * * *